(12) United States Patent
Rogojevic et al.

(10) Patent No.: US 7,728,514 B2
(45) Date of Patent: Jun. 1, 2010

(54) ILLUMINATION SOURCE PROVIDING ENHANCED COLOR MIXING

(75) Inventors: Svetlana Rogojevic, Niskayuna, NY (US); Anil Raj Duggal, Niskayuna, NY (US); Hak Fei Poon, Downingtown, PA (US)

(73) Assignee: General Electric Company, Niskayuna, NY (US)

( * ) Notice: Subject to any disclaimer, the term of this patent is extended or adjusted under 35 U.S.C. 154(b) by 313 days.

(21) Appl. No.: 11/767,711

(22) Filed: Jun. 25, 2007

(65) Prior Publication Data

US 2008/0136317 A1   Jun. 12, 2008

Related U.S. Application Data

(63) Continuation-in-part of application No. 11/567,478, filed on Dec. 6, 2006, now Pat. No. 7,498,603.

(51) Int. Cl.
*H01J 1/62* (2006.01)
*H01J 63/04* (2006.01)

(52) U.S. Cl. ........................ 313/504; 313/506

(58) Field of Classification Search .......... 257/40; 313/504, 506, 507, 51, 512; 353/85; 428/690
See application file for complete search history.

(56) References Cited

U.S. PATENT DOCUMENTS

| | | | | |
|---|---|---|---|---|
| 5,739,552 A | * | 4/1998 | Kimura et al. | 257/89 |
| 5,909,081 A | * | 6/1999 | Eida et al. | 313/504 |
| 5,932,895 A | | 8/1999 | Shen et al. | |
| 5,965,907 A | | 10/1999 | Huang et al. | |
| 6,137,221 A | * | 10/2000 | Roitman et al. | 313/504 |
| 6,166,489 A | | 12/2000 | Thompson et al. | |
| 6,232,714 B1 | | 5/2001 | Shen et al. | |
| 6,429,585 B1 | * | 8/2002 | Kitazume et al. | 313/505 |
| 6,518,709 B2 | * | 2/2003 | Iketsu et al. | 315/169.3 |
| 6,563,139 B2 | * | 5/2003 | Hen | 257/89 |
| 6,693,296 B1 | | 2/2004 | Tyan | |
| 6,747,402 B2 | * | 6/2004 | Hato et al. | 313/305 |
| 6,800,999 B1 | * | 10/2004 | Duggal et al. | 315/169.1 |
| 6,841,949 B2 | | 1/2005 | Duggal | |
| 7,046,316 B2 | | 5/2006 | Lai | |

(Continued)

FOREIGN PATENT DOCUMENTS

JP  10012380 A  1/1998

(Continued)

OTHER PUBLICATIONS

Rogojevic et al., "Color Tunable OLED Illumination Display and Method for Controlled Display Illuminations", Pending U.S. Appl. No. 11/567,475, filed Dec. 6, 2006.

(Continued)

*Primary Examiner*—Peter J Macchiarolo
*Assistant Examiner*—Glenn Zimmerman
(74) *Attorney, Agent, or Firm*—Mary Louise Gioeni

(57) ABSTRACT

An illumination source is disclosed. The illumination source includes at least one OLED layer. The OLED layer includes an active light emitting region including a plurality of primary light-emitting OLED elements and secondary light emitting OLED elements connecting each of the plurality of primary light emitting OLED elements to at least another primary light emitting OLED element.

24 Claims, 18 Drawing Sheets

U.S. PATENT DOCUMENTS

| | | | |
|---|---|---|---|
| 7,090,356 B2* | 8/2006 | Koide | 353/85 |
| 7,271,420 B2* | 9/2007 | Cao | 257/89 |
| 7,417,371 B2* | 8/2008 | Birnstock et al. | 313/506 |
| 7,420,208 B2* | 9/2008 | Yamazaki et al. | 257/59 |
| 7,498,603 B2* | 3/2009 | Rogojevic et al. | 257/40 |
| 7,511,423 B2* | 3/2009 | Noh et al. | 313/507 |
| 7,557,512 B2* | 7/2009 | Kim et al. | 315/169.3 |
| 2001/0033135 A1* | 10/2001 | Duggal et al. | 313/506 |
| 2004/0021425 A1 | 2/2004 | Foust et al. | |
| 2004/0031957 A1* | 2/2004 | Tyan | 257/40 |
| 2004/0032205 A1 | 2/2004 | Hack et al. | |
| 2004/0119402 A1* | 6/2004 | Shiang et al. | 313/506 |
| 2004/0217693 A1* | 11/2004 | Duggal et al. | 313/504 |
| 2004/0246426 A1 | 12/2004 | Wang et al. | |
| 2004/0263056 A1* | 12/2004 | Seo et al. | 313/500 |
| 2005/0142379 A1* | 6/2005 | Juni et al. | 313/506 |
| 2005/0248524 A1 | 11/2005 | Feng et al. | |
| 2005/0280359 A1 | 12/2005 | Liu et al. | |
| 2006/0007099 A1 | 1/2006 | Oh et al. | |
| 2006/0033422 A1* | 2/2006 | Chao et al. | 313/500 |
| 2006/0038770 A1 | 2/2006 | Burkholder | |
| 2007/0159085 A1* | 7/2007 | Kuma et al. | 313/506 |
| 2008/0137008 A1* | 6/2008 | Rogojevic et al. | 349/69 |
| 2008/0203902 A1* | 8/2008 | De Kok et al. | 313/504 |
| 2008/0252202 A1* | 10/2008 | Li et al. | 313/504 |

FOREIGN PATENT DOCUMENTS

| | | |
|---|---|---|
| JP | 11329745 A | 11/1999 |
| JP | 2000036387 A | 2/2000 |
| JP | 2003036973 A | 2/2003 |
| WO | WO9633516 A1 | 10/1996 |
| WO | 2005086257 A1 | 9/2005 |

OTHER PUBLICATIONS

Rogojevic et al., "Color Tunable Illumination Source and Method for Controlled Illumination", Pending U.S. Appl. No. 11/567,478, filed Dec. 6, 2006.

PCT International Search Report dated Jun. 5, 2008.

* cited by examiner

ILLUMINATION SOURCE PROVIDING ENHANCED COLOR MIXING

CROSS REFERENCE TO RELATED APPLICATIONS

This application is a continuation-in-part of U.S. patent application Ser. No. 11/567,478, entitled "COLOR TUNABLE ILLUMINATION SOURCE AND METHOD FOR CONTROLLED ILLUMINATION", filed 6 Dec. 2006, which is herein incorporated by reference.

BACKGROUND

The invention generally relates to color illumination sources. The invention particularly relates to organic light emitting illumination sources.

Previously disclosed color-tunable illumination devices, in particular white light illumination devices, require mixing of colors (for example, red, green, and blue light) to produce a desired color. Typically, the mixing of light with different colors is achieved with a diffuser film. A distance dependent on the pixel size and the arrangement of pixels has to be maintained between the diffuser and the illumination source in order to achieve a homogeneous appearance of mixed light. Typically, the smaller the pixels, the closer the diffuser distance and hence the overall lighting device is less bulky, e.g. in LCD displays. However, reducing the pixel size can significantly increase the cost of manufacturing due to extra pixels/area. Currently known techniques fall short of providing cost effective illumination sources with the required light intensity and color mixing.

It would therefore be highly desirable to provide a cost effective color illumination source, which can provide enhanced color mixing, without the drawbacks discussed above.

BRIEF DESCRIPTION

In one embodiment of the present invention is an OLED layer including at least one OLED layer segment, the OLED layer segment including an active light emitting region, wherein the active light emitting region includes a plurality of primary light-emitting OLED elements and secondary light emitting OLED elements, wherein the secondary light emitting OLED elements connect each of the plurality of primary light emitting OLED elements to at least another primary light emitting OLED element.

In another embodiment of the present invention is an illumination source including a plurality of OLED layers fabricated on different substrates assembled in a stacked configuration, wherein at least one of the plurality of OLED layers includes at least one OLED layer segment including an active light emitting region and a non-light emitting region, wherein the active light emitting region includes a plurality of primary light-emitting OLED elements and secondary light emitting OLED elements connecting each of the plurality of primary light emitting OLED elements to at least another primary light emitting OLED element.

In still another embodiment, is an illumination source including at least one OLED layer segment, the OLED layer segment including groups of plurality of primary light-emitting OLED elements and connecting secondary light emitting OLED elements, wherein the secondary light emitting OLED elements connect each of the plurality of primary light emitting OLED elements to at least another primary light emitting OLED element, wherein the primary light-emitting OLED elements of a group are disposed adjacent to the secondary light emitting elements of another group, wherein at least two of the groups are configured to emit light in different wavelength ranges.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
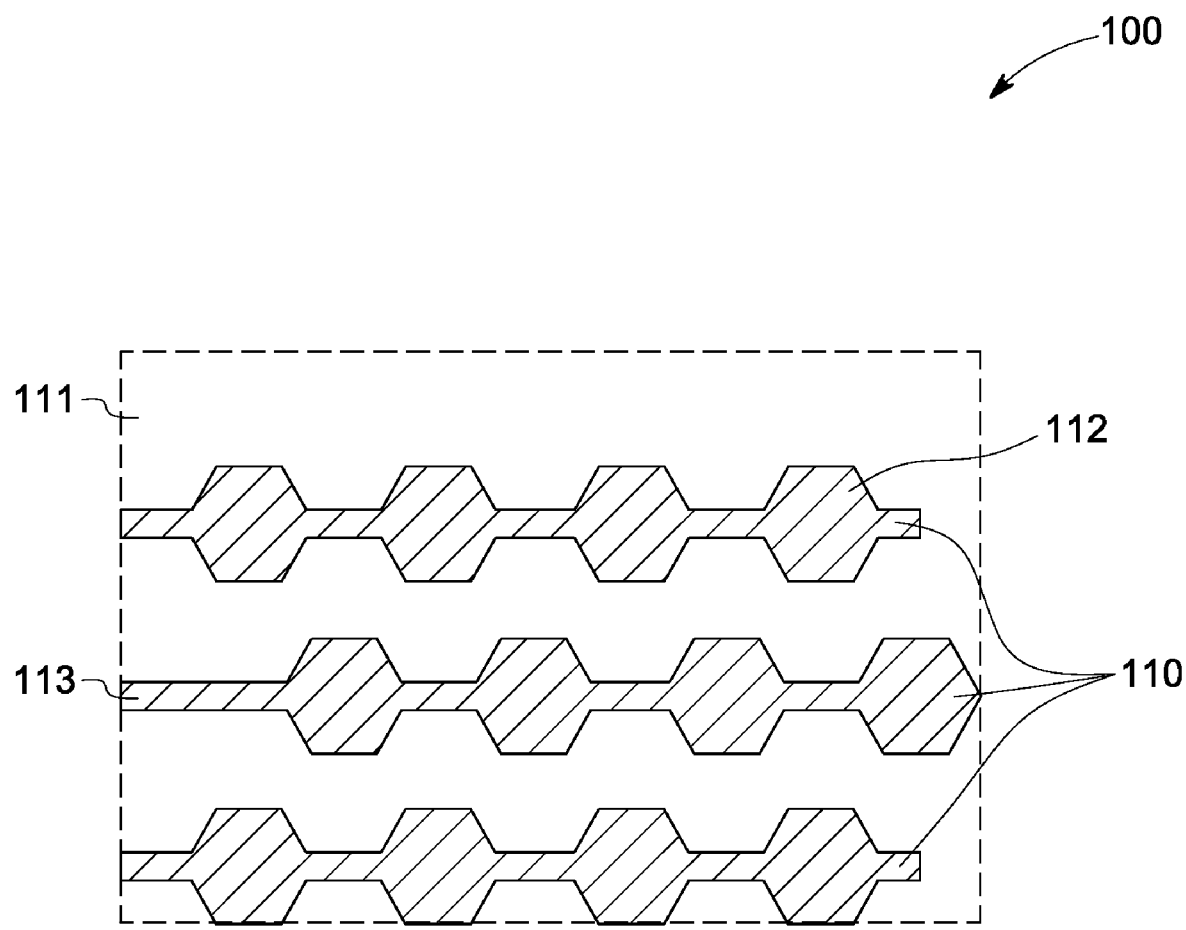
FIG. 1 is a schematic representation of a top view of an OLED layer segment in one embodiment of the present invention.

Embodiments of the present invention relate to organic illumination sources for controllable illumination, systems including such organic illumination sources and methods for controlled illumination.

As used herein, the term "organic illumination source" refers to an organic light emitting device (OLED) illumination source. As used herein, the term "OLED" refers to devices including organic light emitting materials generally, and includes but is not limited to organic light emitting diodes. As used herein, the term "OLED element" refers to the basic light-producing unit of the area illumination sources of the present invention, comprising at least two electrodes with a light-emitting organic material disposed between the two electrodes. OLED elements may include one or more electroactive layers. As used herein, the term "OLED layer" refers to a light-producing unit including at least one OLED element.

The term "electroactive" as used herein refers to a material that is (1) capable of transporting, blocking or storing charge (either positive charge or negative charge), (2) light-absorbing or light emitting, typically although not necessarily fluorescent, and/or (3) useful in photo-induced charge generation, and/or 4) of changing color, reflectivity, transmittance upon application of bias. In the following specification and the claims that follow, reference will be made to a number of terms which shall be defined to have the following meanings. The singular forms "a", "an" and "the" include plural referents unless the context clearly dictates otherwise.

As used herein, the term "disposed on" or "deposited on" refers to disposed or deposited on and in contact with, or disposed or deposited on but with intervening layers therebetween or disposed or deposited on with a finite separation with underlying layers.

As used herein, the term "transparent" refers to greater than 10% average transparency in the visible region of the electromagnetic spectrum. In some embodiments, "transparent" refers to greater than 50% transparency. In still further embodiments, "transparent" refers to greater 80% transparency.

It should be noted that with respect to the interpretation and meaning of terms in the present application, in the event of a conflict between this application and any document incorporated herein by reference, the conflict is to be resolved in favor of the definition or interpretation provided by the present application.

As will be appreciated by one skilled in the art, an OLED element typically includes at least one organic layer, typically an electroluminescent layer, sandwiched between two electrodes. Upon application of an appropriate voltage to the OLED element, the injected positive and negative charges recombine in the electroluminescent layers to produce light.

In one embodiment of the present invention, the OLED illumination includes a plurality of OLED layers stacked together. The OLED layers include one or more OLED layer segments. The OLED layer segments include an active light emitting region and a non-light emitting region. The OLED layers are disposed such that light emitted by the active light emitting regions of an OLED layer is transmitted through the non-light emitting regions of the subsequent OLED layer or layers and emerges out of the illumination source.

In one embodiment, an active light emitting region includes a plurality of primary light-emitting OLED elements and secondary light emitting OLED elements connecting each of the plurality of primary light emitting OLED elements to at least another primary light emitting OLED element.

A top view of an OLED layer segment 100 is schematically represented in FIG. 1. The OLED layer segment 100 includes an active light emitting region 110 and a non-light emitting region 111. In the illustrated embodiment of FIG. 1, the active light emitting region 110 includes hexagonal shaped primary light emitting elements 112 and strip shaped connecting secondary light emitting elements 113.

Although in FIG. 1 the primary light emitting OLED element and the secondary OLED light emitting element are shaped as a regular hexagonal and a strip respectively, the invention is not envisioned to be limited to the shapes described in the figures and description herein. All shapes of primary and secondary light emitting elements, both regular and irregular fall within the scope of this invention. Non-limiting examples of regular shapes include square, rectangular, triangular, pentagonal, hexagonal, quadrilateral, trapezoidal and rhombic, circular, and elliptical. In a further example, a regularly shaped element may have equal or unequal sides, for example a hexagonal may be fabricated with equal or unequal sides. In another example, the shapes may be irregular. In one embodiment, differently shaped primary or secondary elements may be present in a single OLED segment or layer.

In one embodiment, the area of the primary light emitting OLED element is greater than the area of the secondary light emitting OLED element. In one embodiment, an OLED layer segment includes one or more groups of connected primary light emitting OLED elements, where the secondary light emitting OLED elements connect the primary light emitting elements. In a further embodiment, an OLED layer segment further includes internal series interconnect elements (as disclosed in U.S. Pat. No. 7,049,757 B2) to connect the cathode of one OLED layer segment to the anode of another OLED layer segment.

In one embodiment, the non-light emitting region includes inactive non-light emitting OLED elements. The inactive non-light emitting OLED elements lack a metallized electrode. On deposition of a patterned electrode over an electroluminescent layer to form an OLED device, the areas with the electrode material forms the light emitting region including the active light emitting elements, while the areas which lack the electrode material forms the inactive light emitting region.

In an alternate embodiment, the non-light emitting region includes substrate regions without OLED elements disposed over. In one embodiment, the non-light emitting region is configured to transmit greater than 50% of incident light in the visible region of the electromagnetic spectrum. In a further embodiment, the non-light emitting region is configured to transmit greater than 70% of incident light in the visible region of the electromagnetic spectrum. In one embodiment, the non-light emitting region is configured to transmit greater than 90% of incident light in the visible region of the electromagnetic spectrum.

Figure 2:
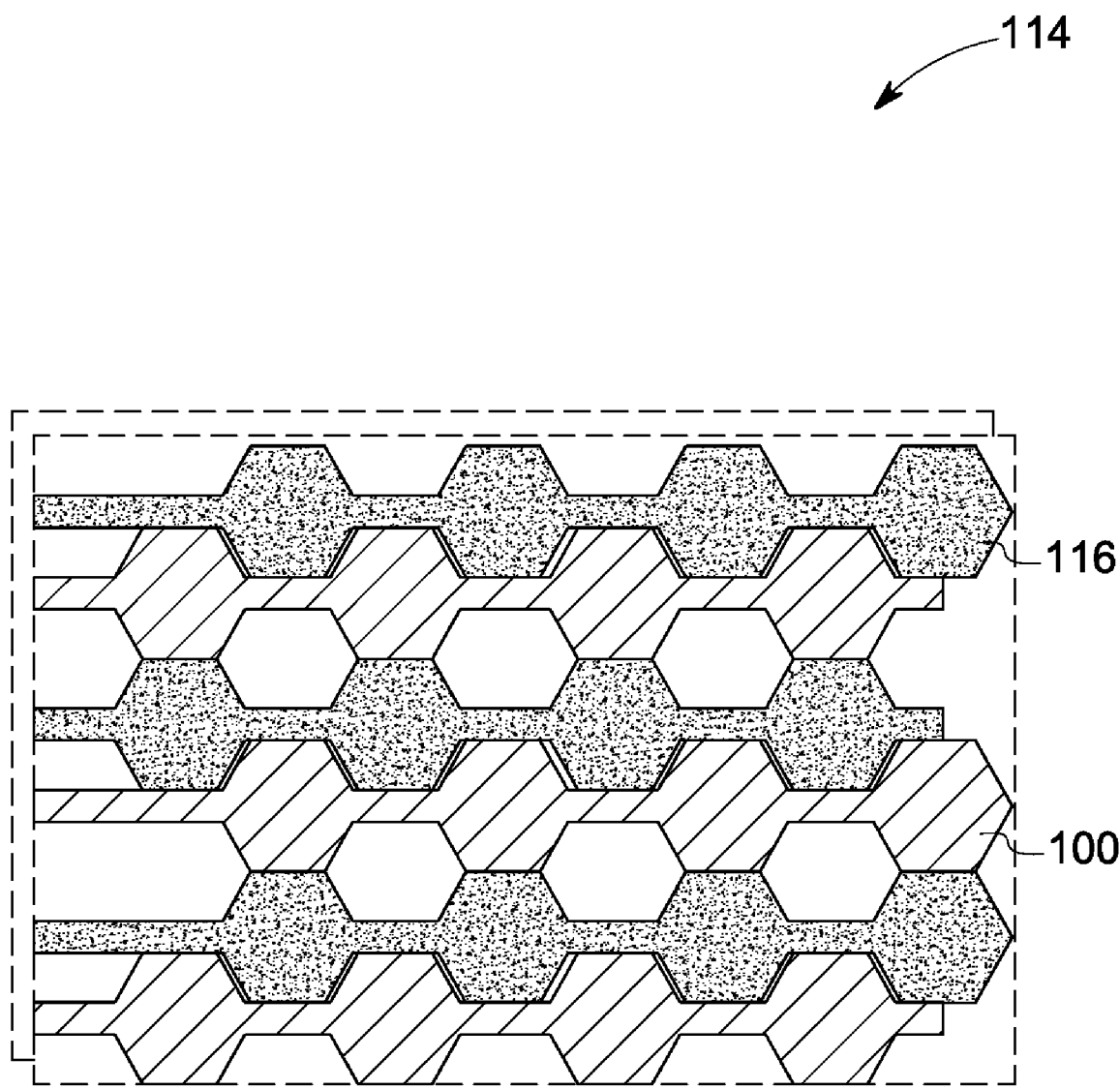
FIG. 2 is a schematic representation of a top view of two overlaid OLED layers in one embodiment of the present invention.

FIG. 2 illustrates the top view of an arrangement 114 of two overlaid OLED layers including OLED layer segments 100 and 116 respectively of each OLED layer, each OLED layer emitting light in wavelength range different from the other.

Figure 3:
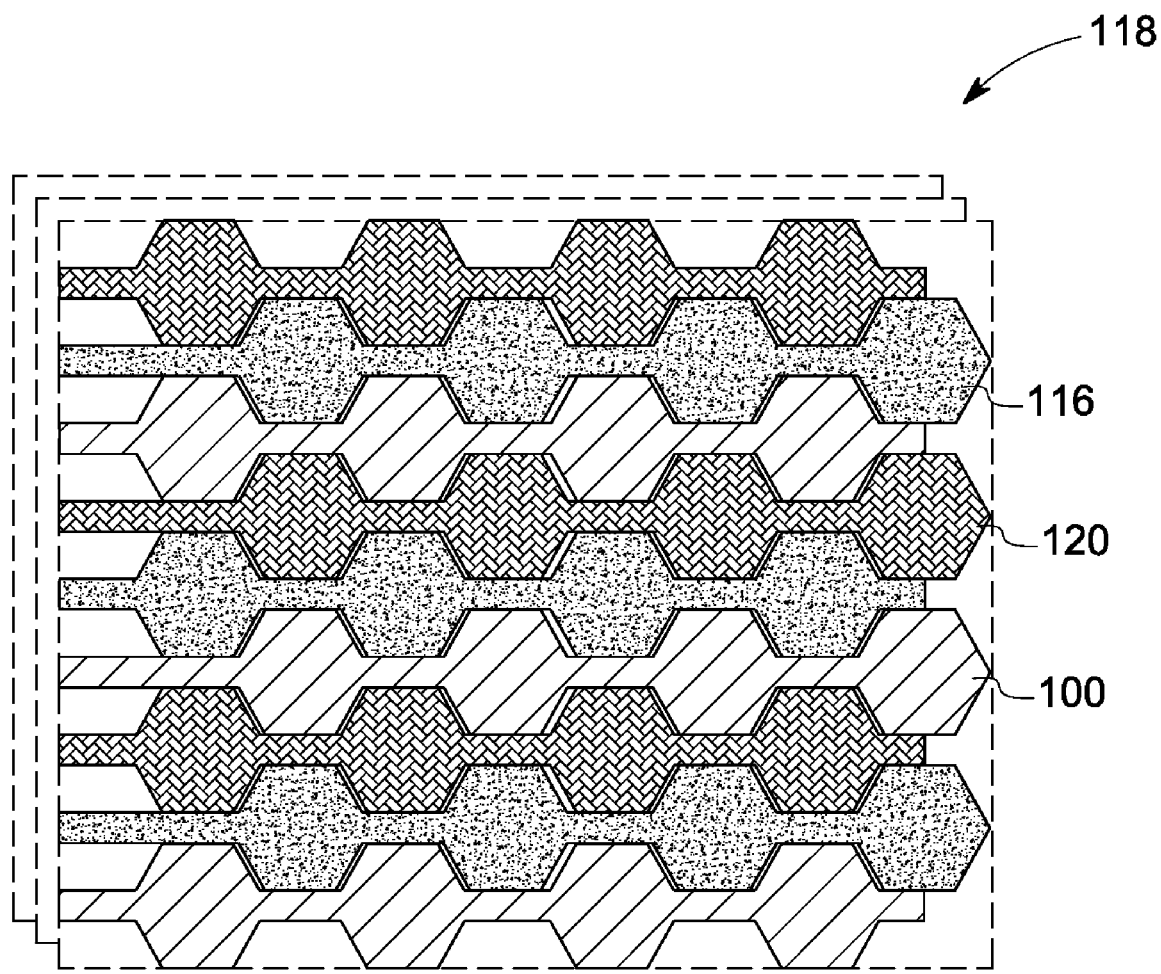
FIG. 3 is a schematic representation of a top view of an illumination source including three overlaid OLED layers in one embodiment of the present invention.
Figure 4:
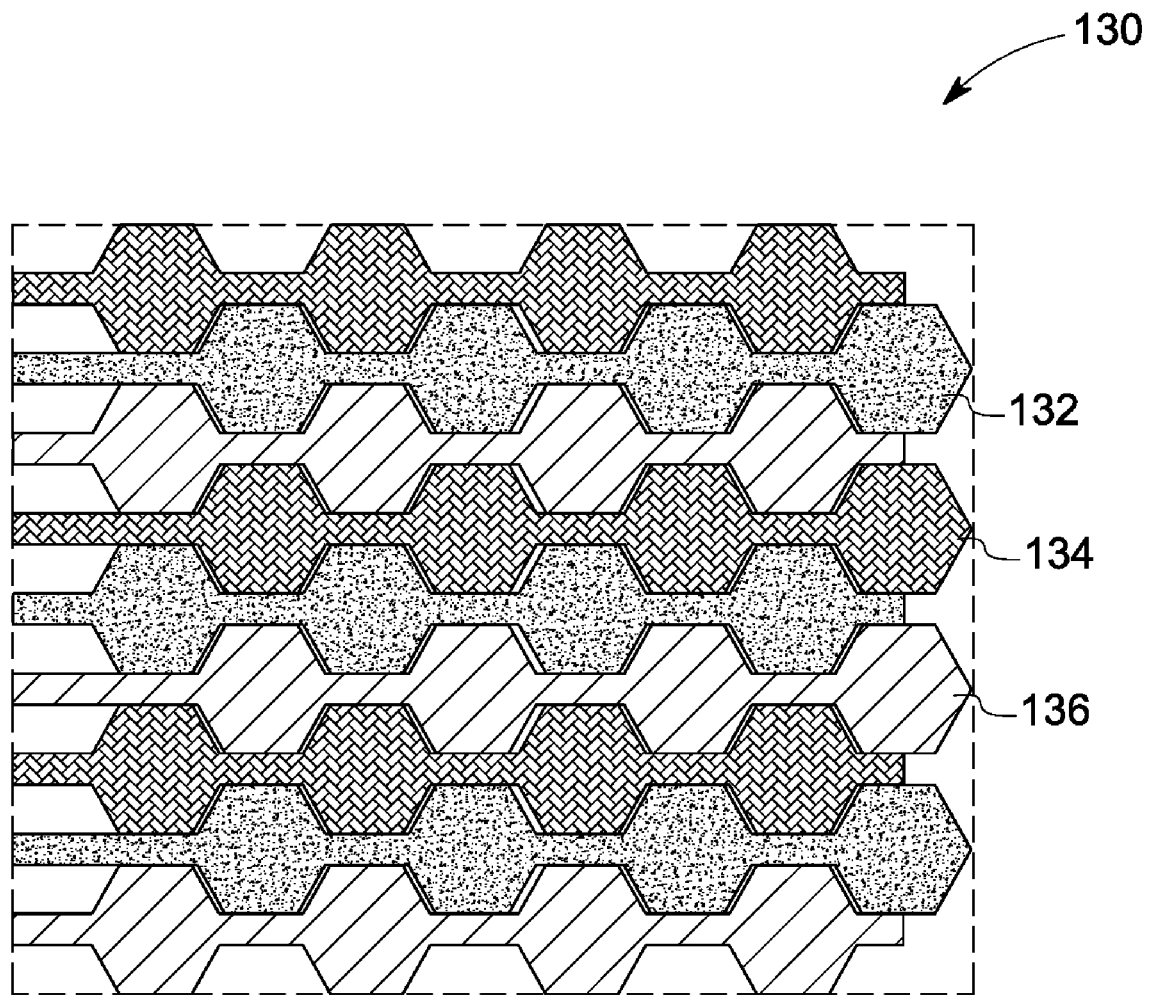
FIG. 4 is a schematic representation of a top view of an illumination source including groups of connected primary light emitting OLED elements emitting at different wavelength ranges fabricated on a single substrate, in one embodiment of the present invention.

In the top view of a schematic illustration of an illumination source 120 shown in FIG. 3 a stacked arrangement of three overlaid OLED layers each including the OLED layer segments 100, 116 and 118 respectively, and emitting light at wavelength ranges different from each other. In one embodiment, for example, the three OLED layers emit light in the blue wavelength range, green wavelength range and red wavelength range. In one embodiment, a transparent adhesive layer is used to stack together the three OLED layers.

In one embodiment as illustrated in FIG. 3, this arrangement provides for close packing of the OLED elements emitting in different wavelength ranges as viewed from the top and hence enhances the color mixing in the illumination source. In one particular example, the secondary elements of a first OLED layer is disposed partially over the primary light emitting elements of a second OLED layer and partially obscures the light emitted by the underlying layer. By having appropriately shaped primary and secondary OLED elements and their arrangement in a layer, the stacking of the different OLED layers can aid in the close packing of the OLED elements and provide the desired color mixing. In one embodiment the invention provides for increased fill factor and enhanced color mixing. As used herein, the term "fill factor" here is defined as percentage of the visible area of the light source, emitting the light visible to the viewer, divided by the total visible area of the light source. In one embodiment, enhanced fill factor in the disclosed light source is achieved by locating the internal series interconnect zone in the narrow segments (narrower than the primary OLED elements), and by close packing of visible elements of the two or more vertically stacked OLED layers. The fill factor can thus be increased compared to known arrangement of OLED elements. Quality of the color mixing can be measured by the distance of a given optical diffuser needed to completely obscure the RGB (red, blue, green) structure of the OLEDs, so that the color of the light source appears substantially spatially uniform to the viewer. In one embodiment, enhanced color mixing of the disclosed structure is due to the two-dimensional lateral color mixing, as the RGB OLED elements are arranged in a manner similar to a checkerboard or zigzag pattern, rather than RGB stripes.

In one embodiment, a combined fill factor of the active light emitting region of the plurality of layers is greater than about 90% within an area enclosing all OLED elements as viewed from the light emerging plane of the illumination source. In a further embodiment, a combined fill factor of the active light emitting region of the plurality of layers is greater than about 95% within an area enclosing all OLED elements as viewed from the light emerging plane of the illumination source. In a still further embodiment, a combined fill factor of the active light emitting region of the plurality of layers is greater than about 98% within an area enclosing all OLED elements as viewed from the light emerging plane of the illumination source.

In one embodiment, the illumination source may include a light management layer element such as a diffuser element. As discussed above, diffuser elements can aid in color mixing. In one embodiment of the present invention, the distance at which the diffuser is disposed to obtain a desired level of color mixing is less than about 25 mm. In a further embodiment of the present invention, the distance at which the diffuser is disposed to obtain a desired level of color mixing is less than about 5 mm. In still another embodiment of the present invention, the distance at which the diffuser is disposed to obtain a desired level of color mixing is at 0 mm, where the diffuser is in direct contact with OLED substrate. Other examples of a light management element include but are not limited to a scattering element, a high contrast patterned element, a transparent white light emitting element, lens, and combinations thereof.

Figure 11:
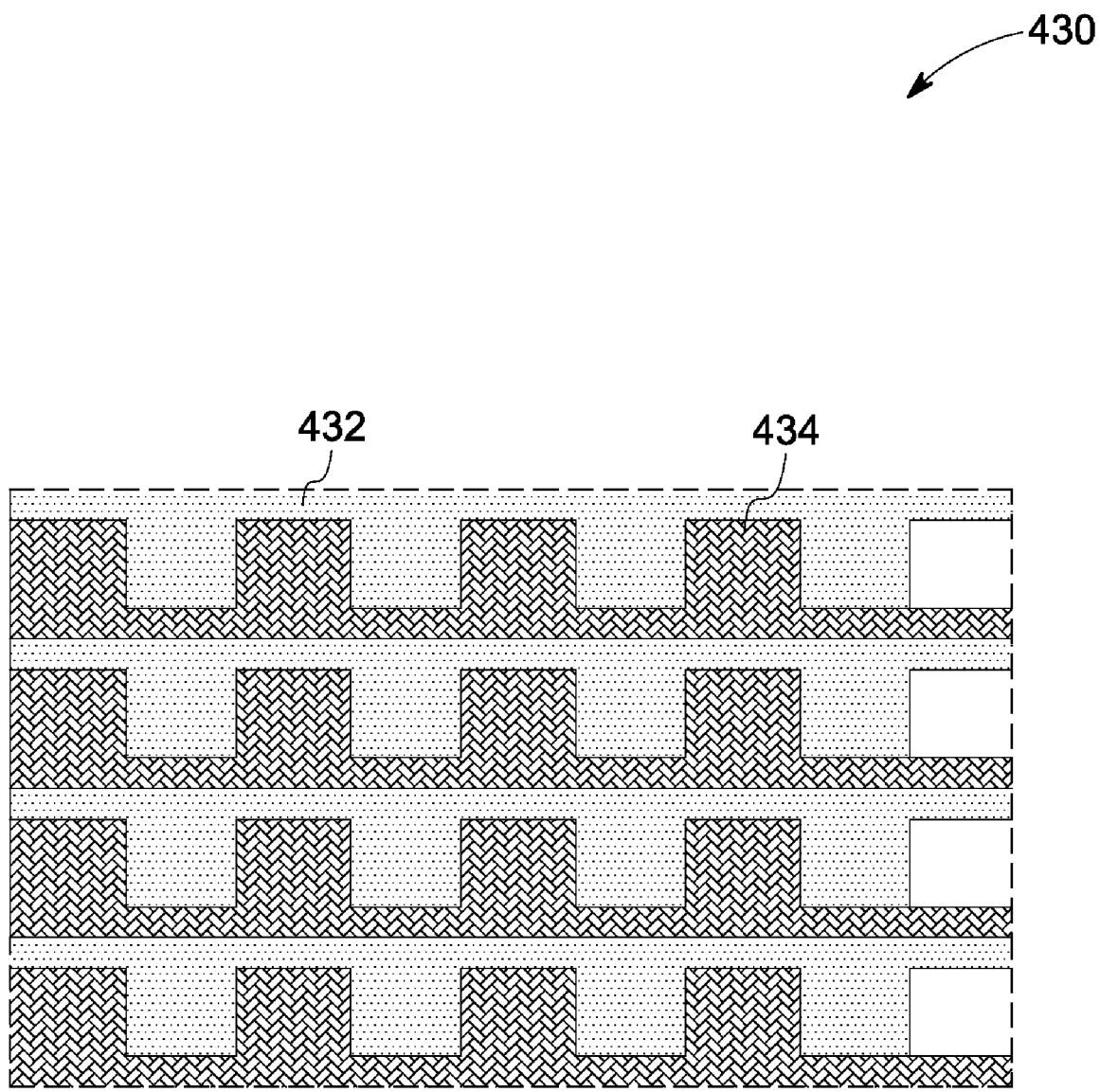
FIG. 11 is a schematic representation of a top view of an illumination source including groups of connected primary light emitting OLED elements emitting at different wavelength ranges fabricated on a single substrate, in one embodiment of the present invention.

In an alternate embodiment, an OLED layer including at one least OLED layer segment includes one or more groups of connected primary light emitting OLED elements, where the secondary light emitting OLED elements connect the primary light emitting elements. In a non-limiting example, a single OLED layer may be fabricated with groups of connected primary light emitting elements, where the groups may emit light at different wavelength ranges. FIG. 11 illustrates an illumination source 130 including a OLED layer including groups 132, 134, 136 of primary light emitting OLED elements connected by secondary light emitting elements, where groups 132, 134, and 136 emit at a wavelength ranges different from each other, for example in blue, green and red respectively.

Figure 5:
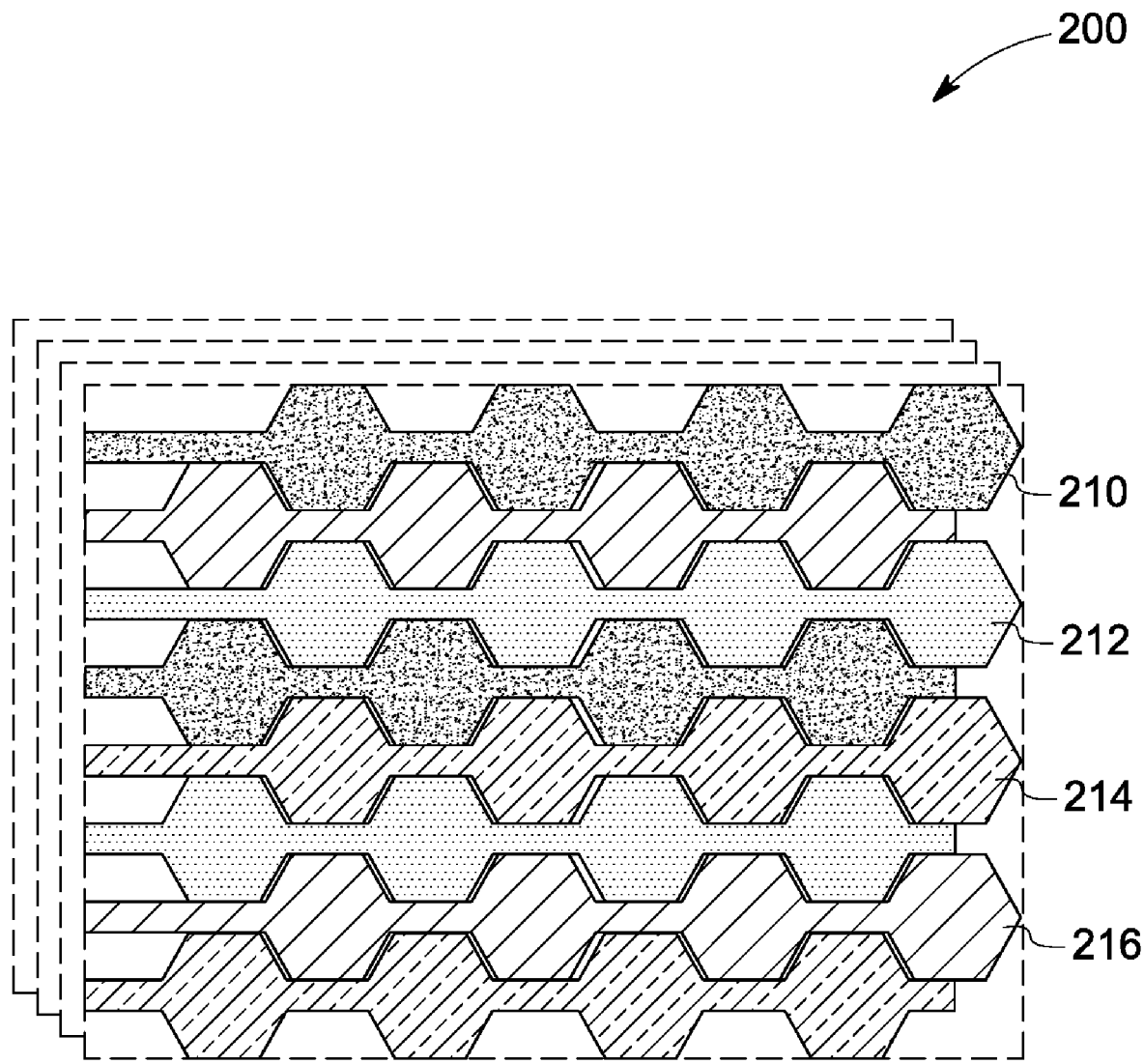
FIG. 5 is a schematic representation of a top view of an illumination source including four overlaid OLED layers in one embodiment of the present invention.

In one embodiment, the stacked OLED layers 200, as illustrated in FIG. 5, may also include a white light emitting OLED layer 216, besides for example a blue OLED layer 210, a green OLED layer 212, and a red OLED layer 214. In another embodiment, the stacked OLED layers 200 for example may include three blue emitting OLED layers (210, 212, and 214) with a down conversion green and red phosphoresecnt materials being included in layers 212 and 214, respectively.

Figure 6:
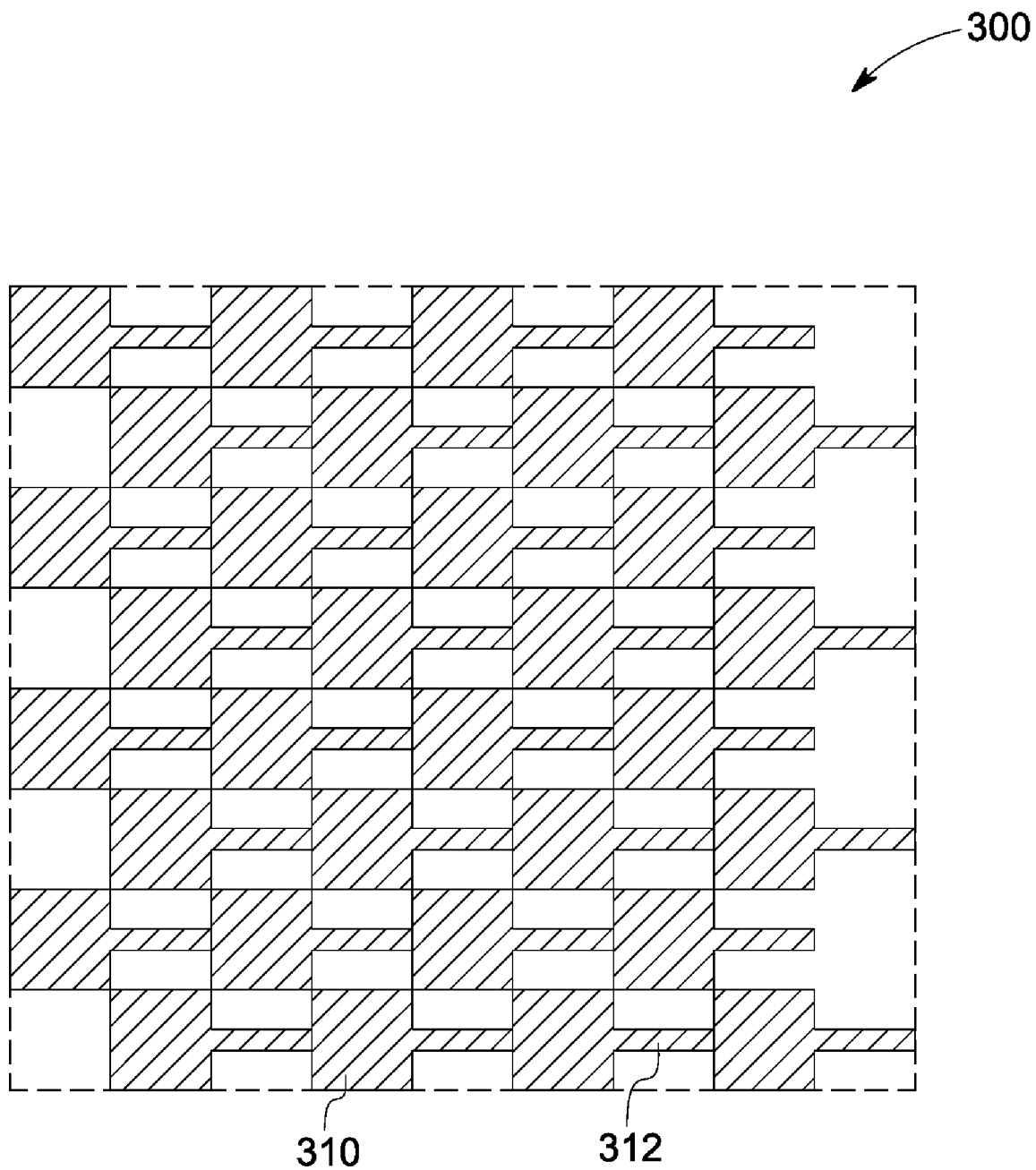
FIG. 6 is a schematic representation of a top view of an OLED layer segment in one embodiment of the present invention.

As discussed above, the OLED elements in the embodiments of the present invention can be of varied shapes and sizes. For example, in the embodiment illustrated in FIG. 6, the OLED layer segment 300 includes square shaped White light emitting OLED layer 310 with small strip or rectangular shaped connecting secondary elements 312, connecting the elements along the middle of the primary elements. The illustrated OLED layer segment 300 includes eight rows of OLED elements.

Figure 7:
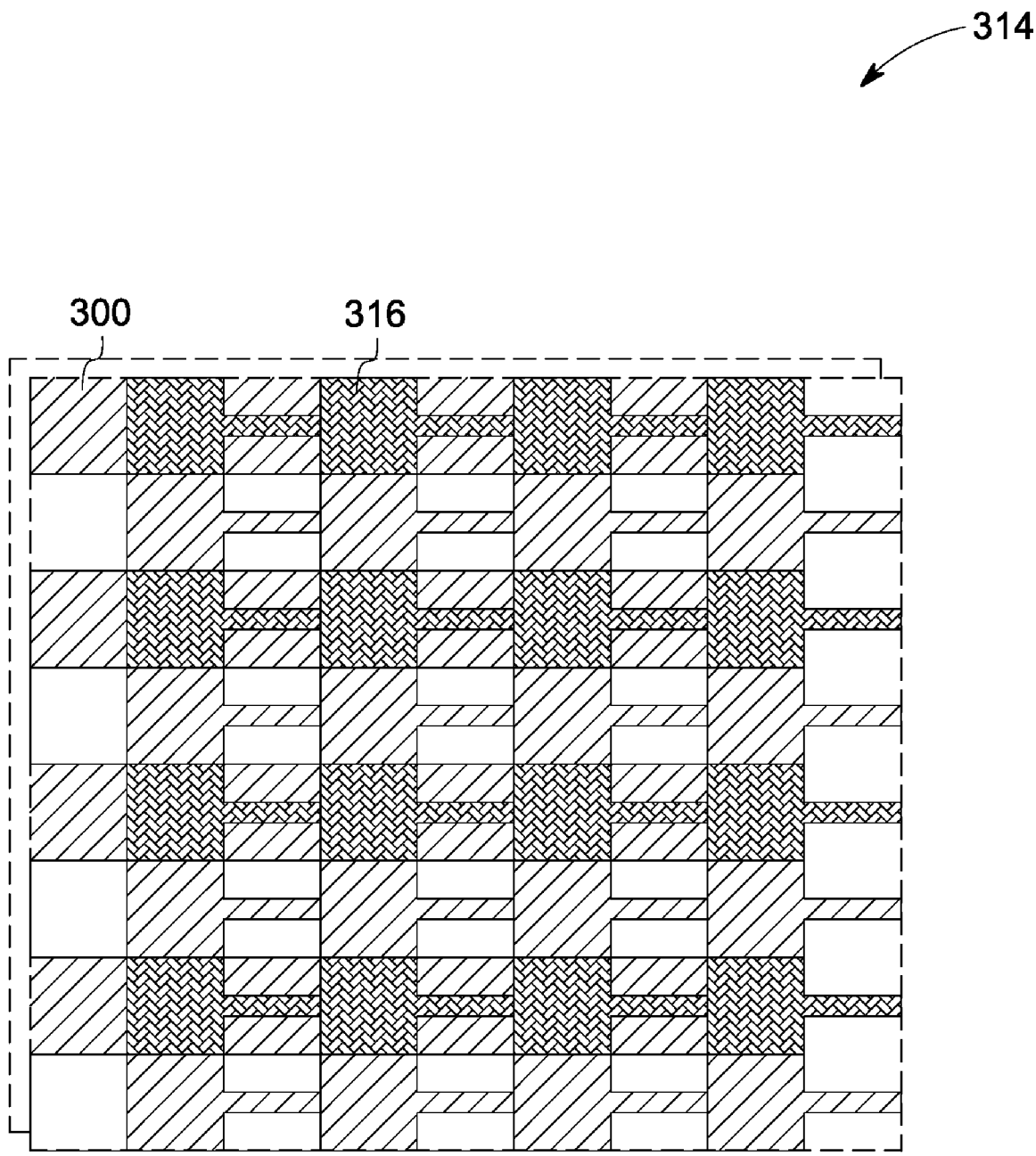
FIG. 7 is a schematic representation of a top view of two overlaid OLED layers in one embodiment of the present invention.
Figure 8:
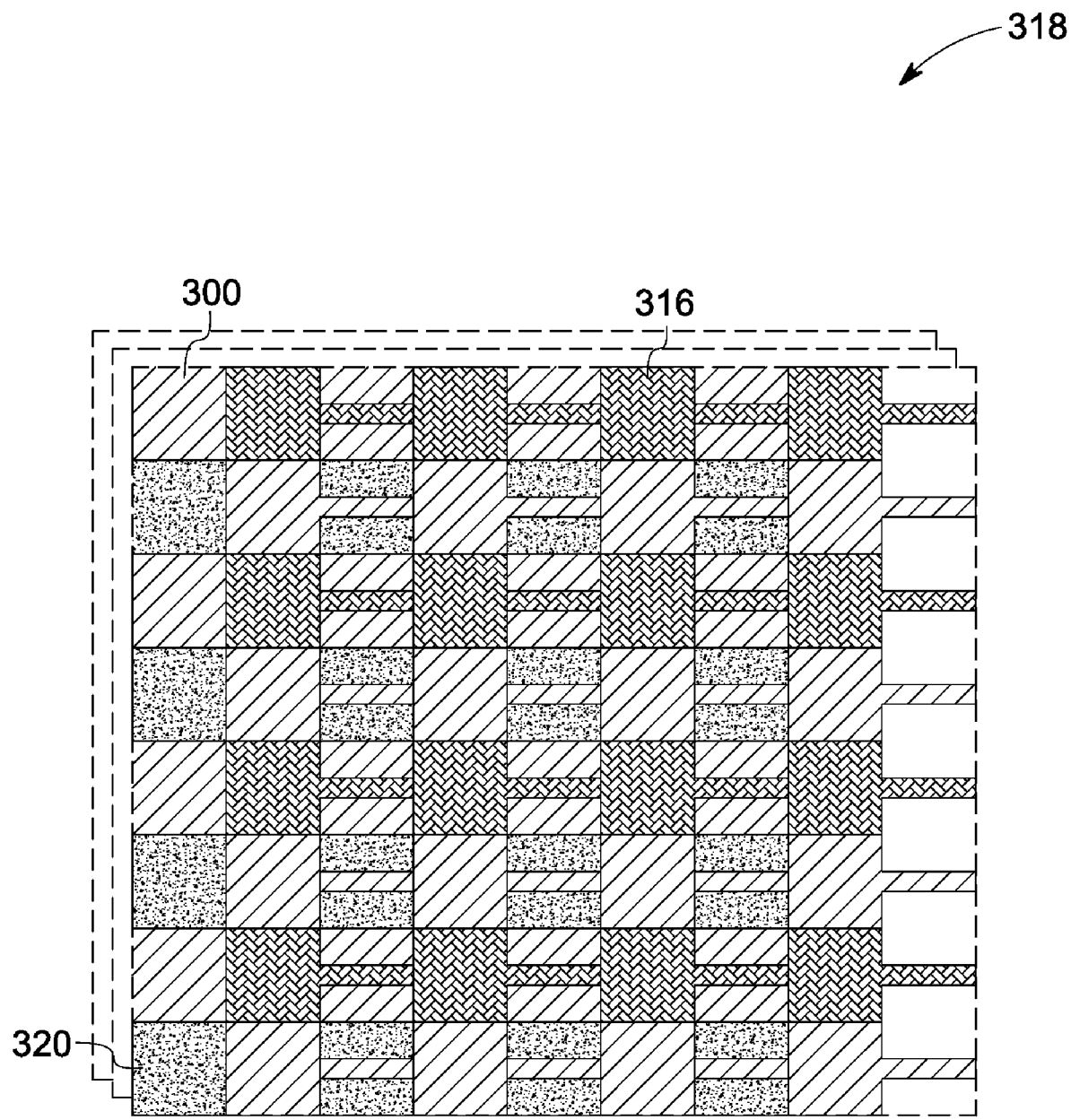
FIG. 8 is a schematic representation of a top view of an illumination source including three overlaid OLED layers in one embodiment of the present invention.

FIG. 7 illustrates a stacked arrangement 314, where an OLED layer including an OLED layer segment 316 is overlaid on top of another OLED layer including the OLED layer segment 300. In one example, the OLED layer segment 316 emits at a wavelength range different from the OLED layer segment 300. The OLED layer 316 as illustrated includes 4 rows of OLED elements. In the stacking arrangement illustrated in FIG. 7, many of the secondary light emitting OLED elements of the OLED layer segment 316 are fully disposed over the primary elements of the OLED layer segment 300. In the top view of the illumination source 318 shown in FIG. 8, three OLED layers including the OLED layer segments 300, 316, 320 are arranged in a stacked configuration.

Figure 9:
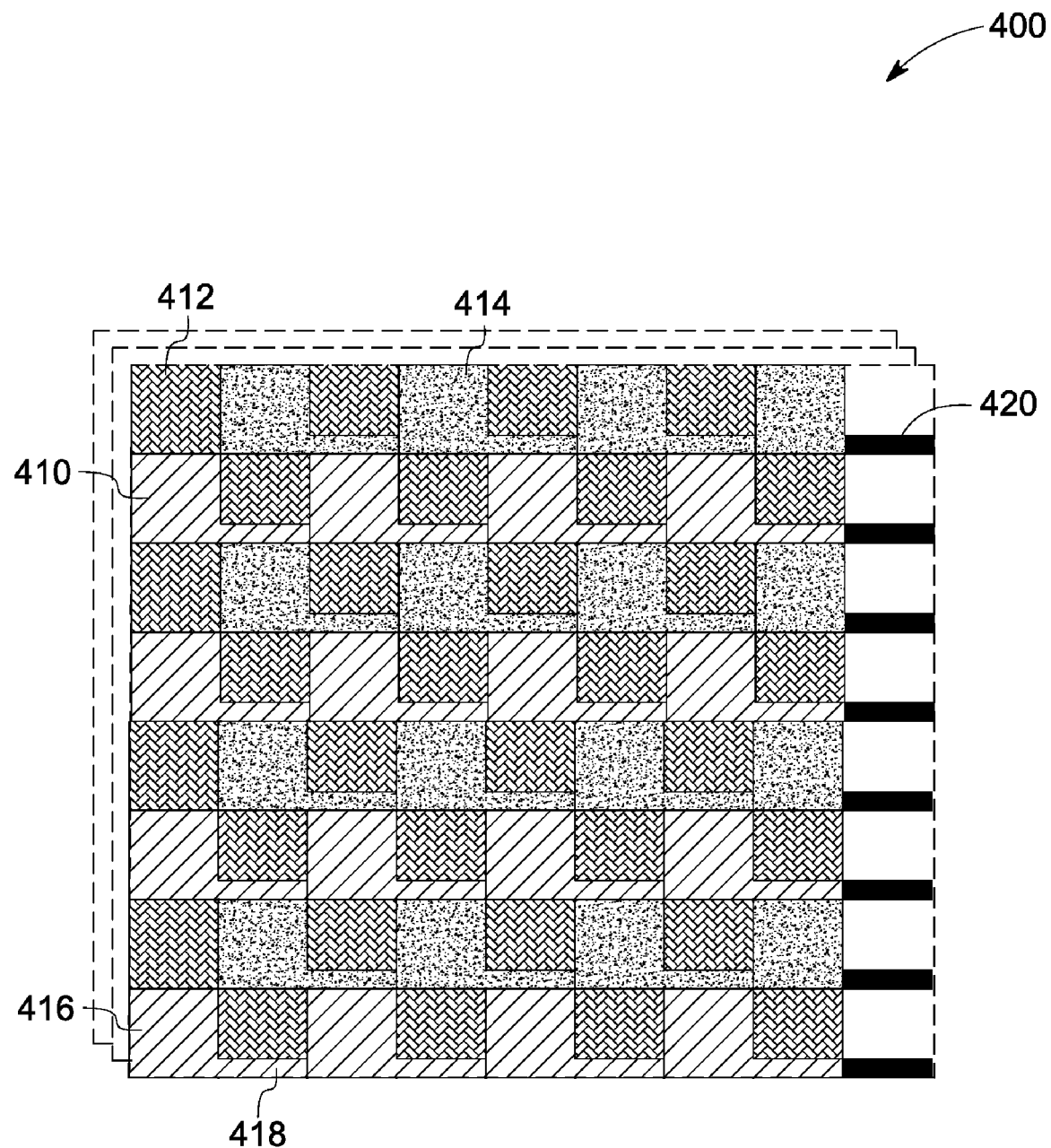
FIG. 9 is a schematic representation of a top view of an illumination source including three overlaid OLED layers in one embodiment of the present invention.
Figure 10:
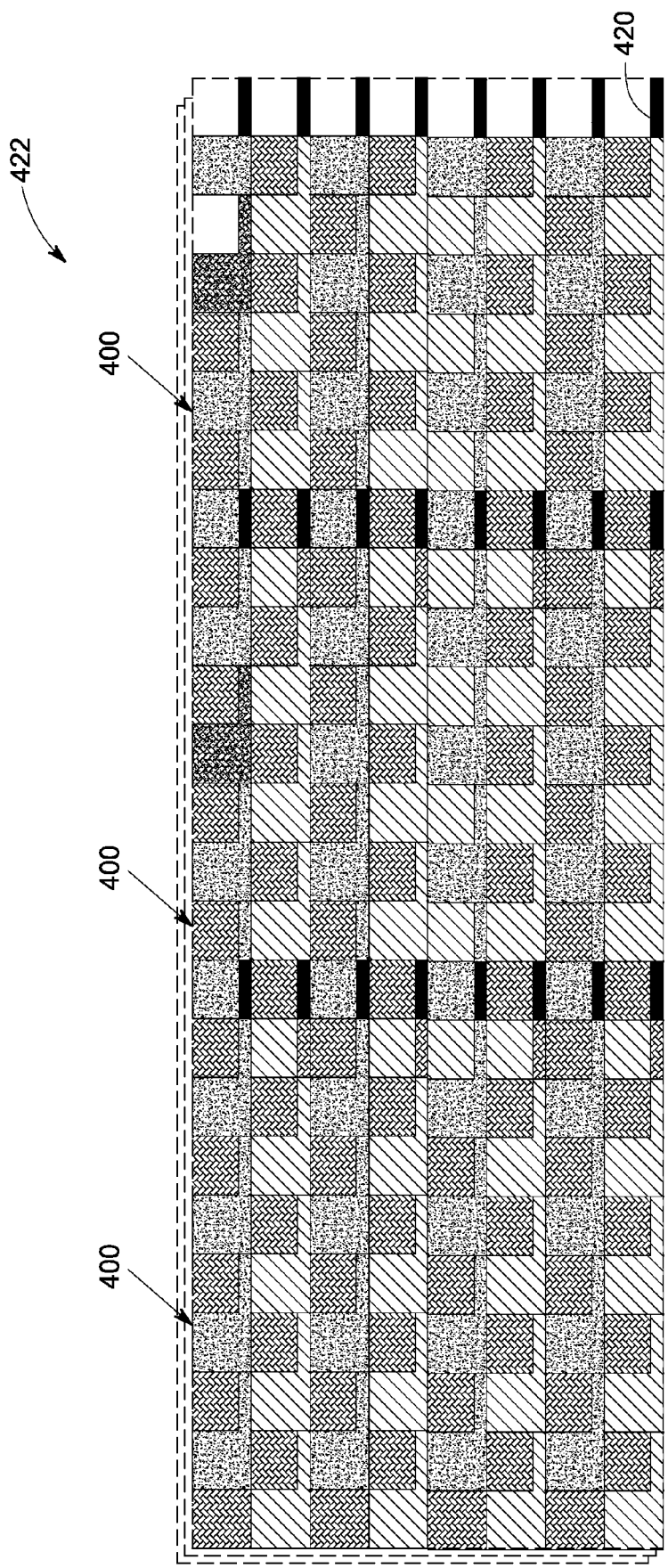
FIG. 10 is a schematic representation of a top view of an illumination source including a plurality of OLED segments in one embodiment of the present invention.

FIG. 9 illustrates the stacked configuration 400 of three different OLED layers 410, 412, and 414. In this illustrated embodiment, the secondary OLED elements 418, as well as the interconnecting elements 420 are found laterally aligned with the bottom side of the primary elements 416. In one embodiment, the OLED segments are configured such that a plurality of such segments can be electrically interconnected through interconnect elements 420 to form an OLED layer. FIG. 10 illustrates an illumination source 422 including three stacked OLED layers, where each of the OLED layers is constructed by interconnecting 3 OLED segments in series.

In an alternate embodiment, a single OLED layer may be fabricated with groups of connected primary light emitting elements, where the groups may emit light at different wavelength ranges. FIG. 11 illustrates an illumination source 430 including a OLED layer including groups 432, 434 of primary light emitting OLED elements connected by secondary light emitting elements, where group 432 emits at a wavelength range different from group 434.

Figure 12:
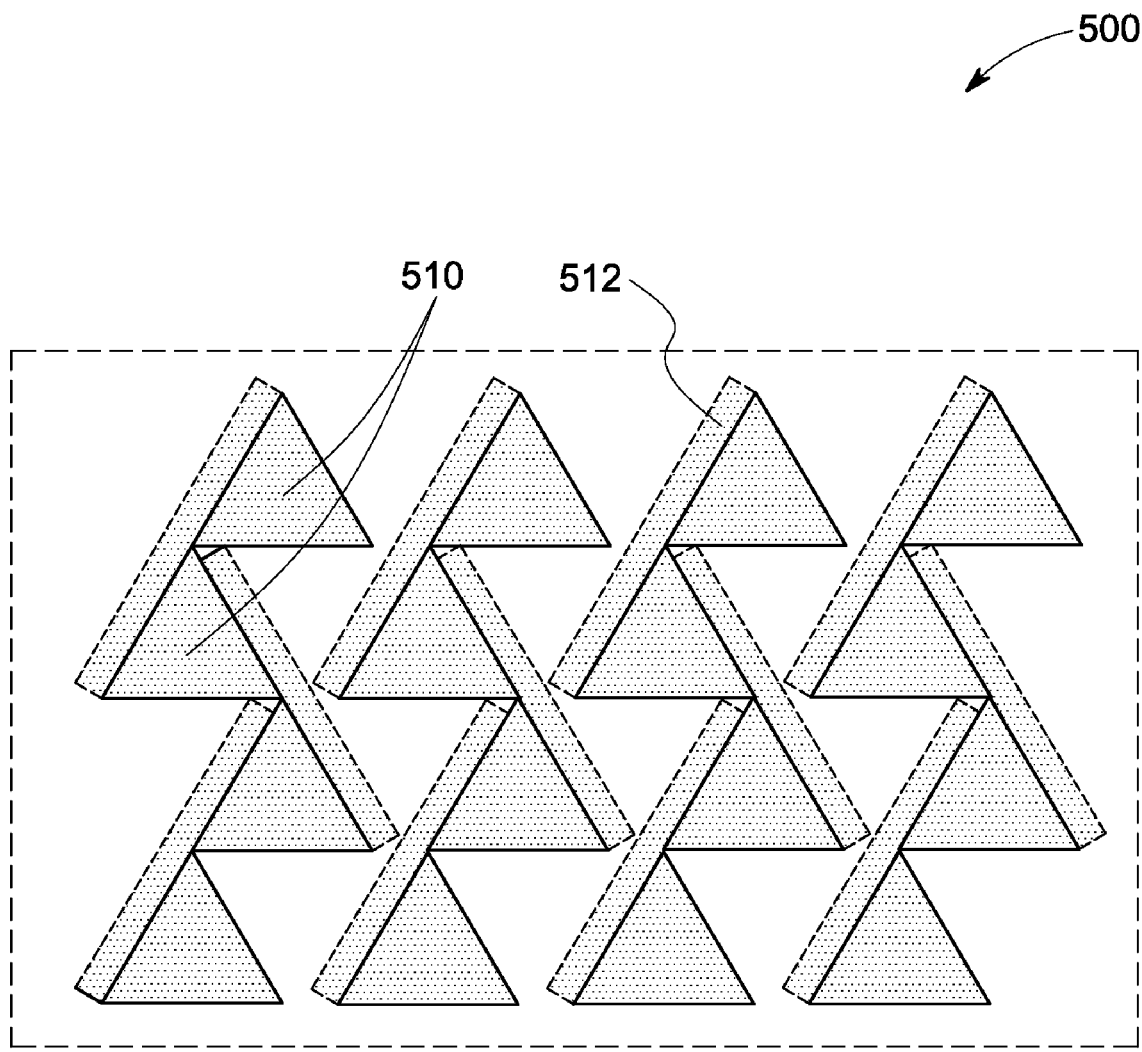
FIG. 12 is a schematic representation of a top view of an OLED layer segment in one embodiment of the present invention.
Figure 13:
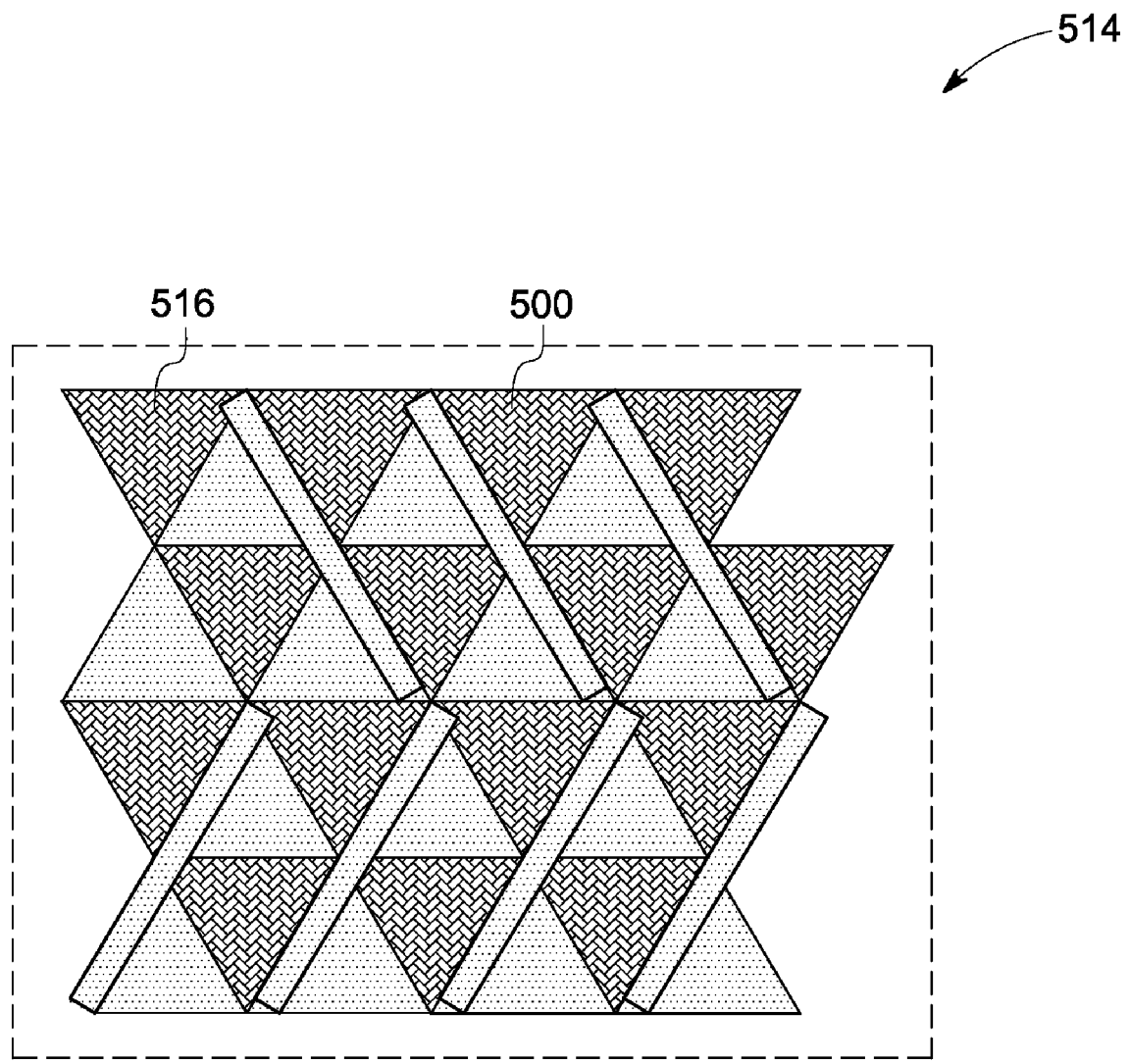
FIG. 13 is a schematic representation of a top view of two overlaid OLED layers in one embodiment of the present invention.
Figure 14:
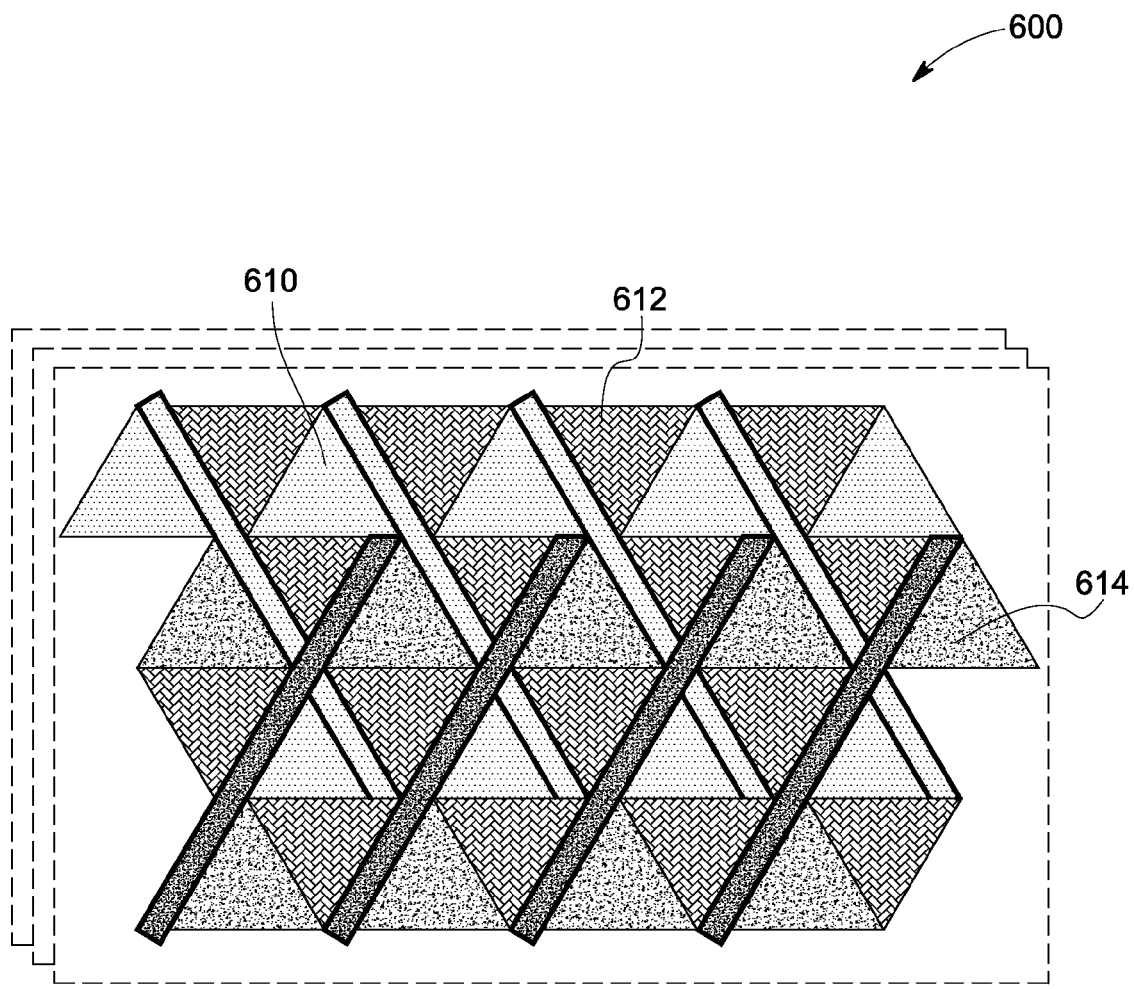
FIG. 14 is a schematic representation of a top view of an illumination source including three overlaid OLED layers in one embodiment of the present invention.

A top view of an OLED layer 500 including triangular primary OLED elements 510 is illustrated in FIG. 12. The OLED layer includes vertically angled strips of connecting secondary light emitting elements 512, disposed in contact with one side of the primary light emitting elements 510. The connecting elements may be fabricated to traverse and be in contact fully or partly with a side of the triangular primary light emitting OLED element. FIG. 13 illustrates an illumination source 514 with two OLED layers 500 and 516 with triangular elements stacked. In another illustrated embodiment shown in FIG. 14, three OLED layers 610, 612, 614 emitting light in three different wavelength ranges are stacked to form an illumination source 600.

Figure 15:
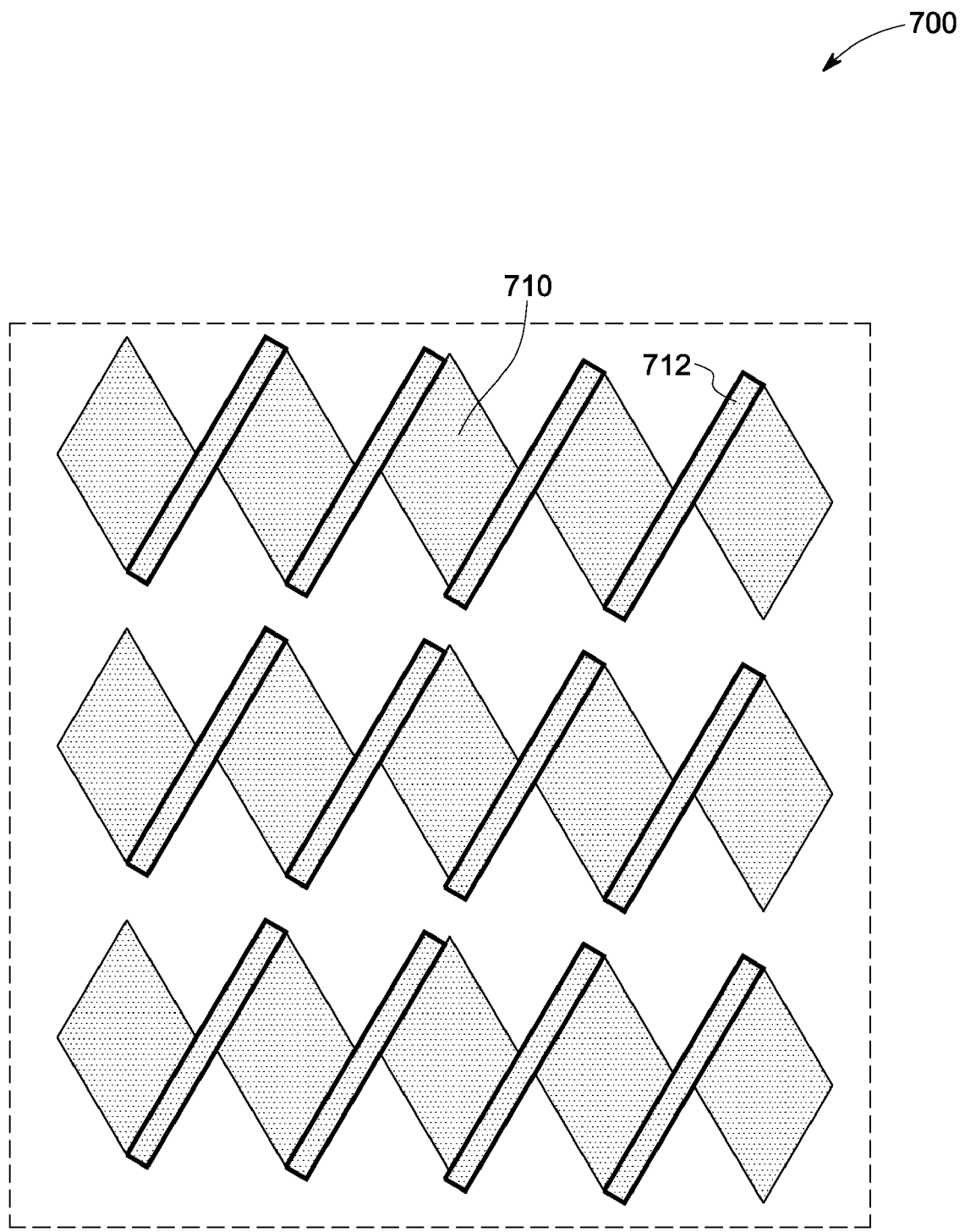
FIG. 15 is a top view of an OLED layer segment in one embodiment of the present invention.
Figure 16:
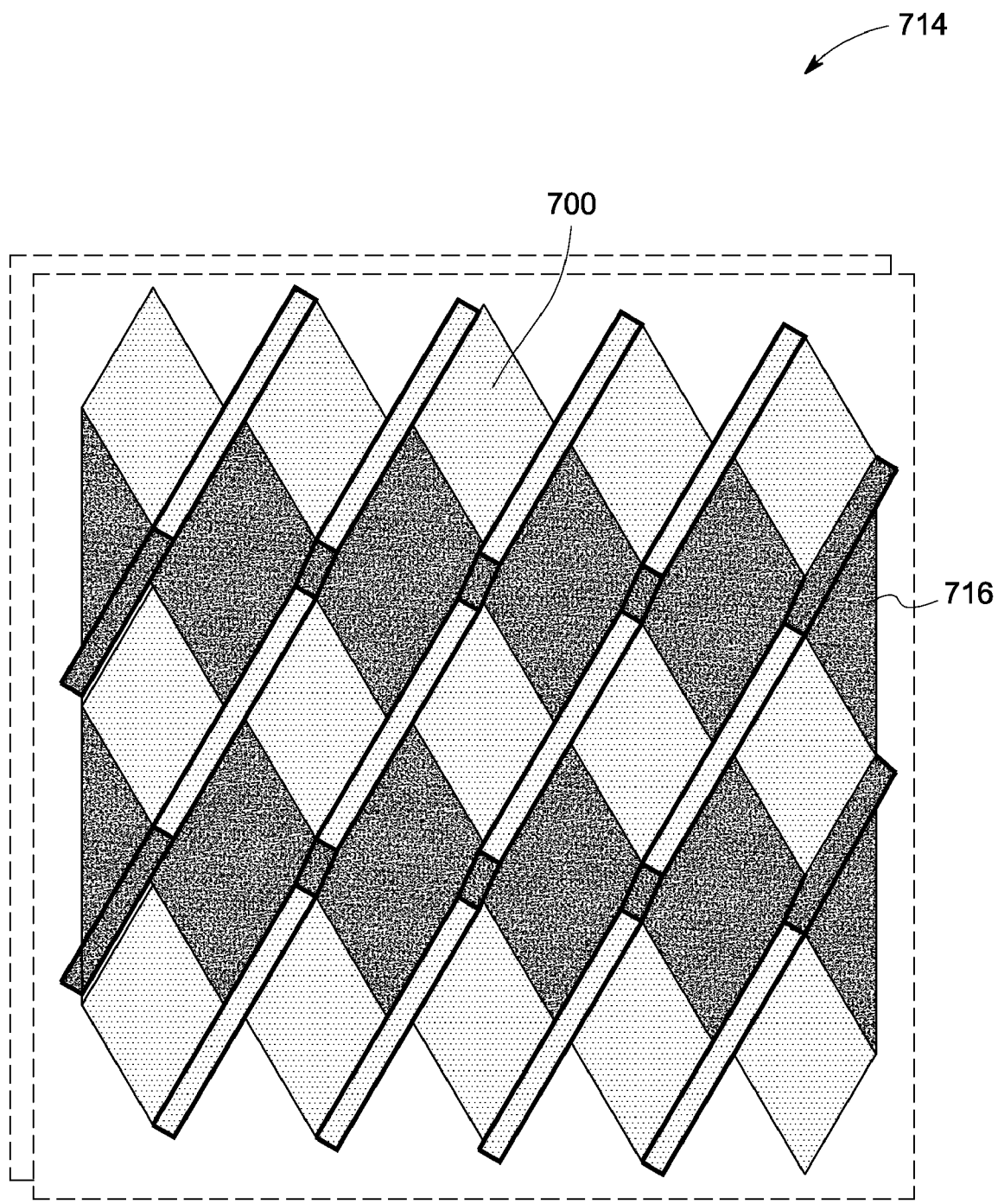
FIG. 16 is a top view of two overlaid OLED layers in one embodiment of the present invention.

FIGS. 15 and 16 illustrate OLED layers with rhombic primary light emitting elements. An OLED layer 700 includes rhombic primary light emitting OLED elements 710 with vertically angled strips of secondary light emitting OLED elements 712 connecting the primary elements 710. The illumination source 714 includes two overlaid layers 700 and 716.

In one embodiment, an OLED layer includes a flexible substrate. In a further embodiment, one or more OLED layers may be mounted on a structure to form a curved illumination source. In another embodiment, one or more OLED layers may be mounted on a panel to from a planar illumination source.

Figure 17:
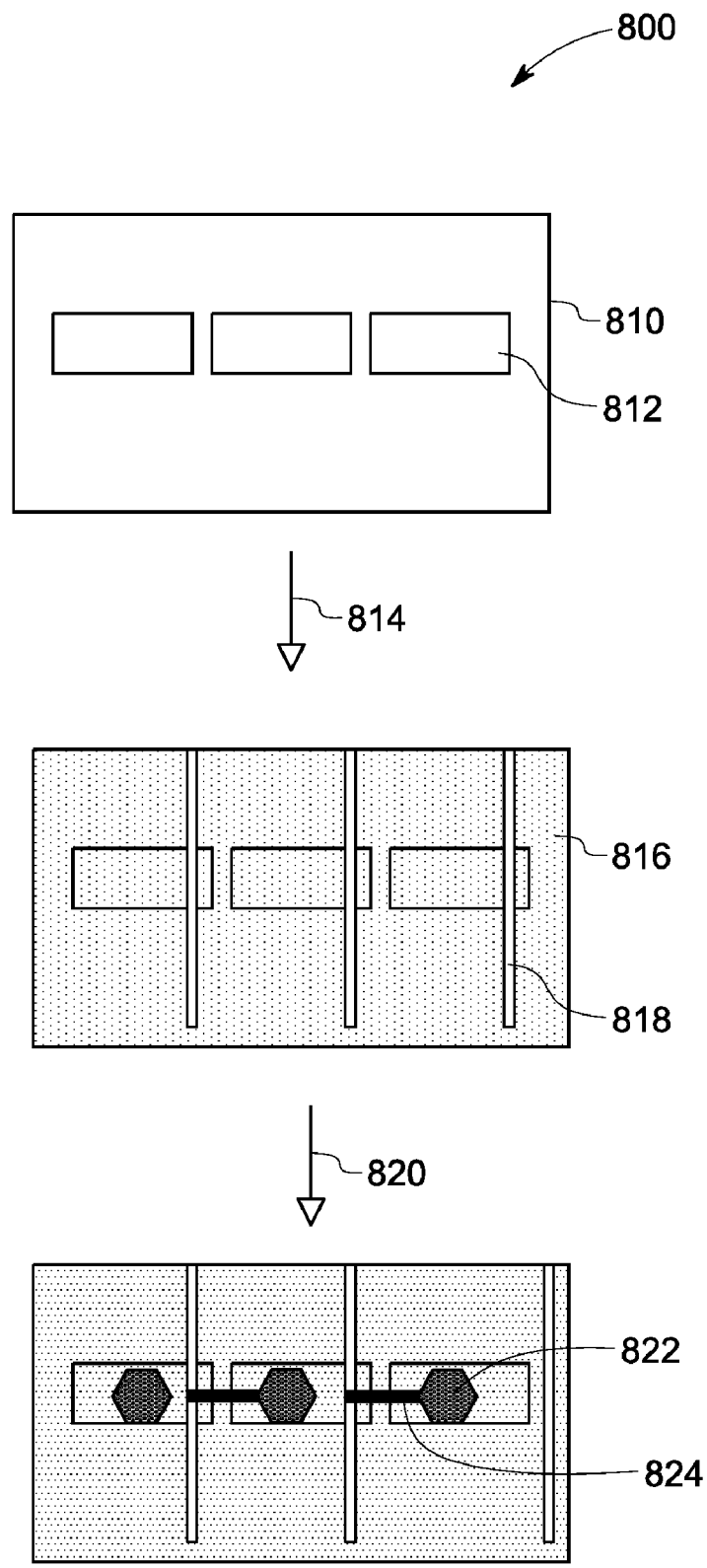
FIG. 17 is a schematic representation of a method for fabricating an OLED layer in one embodiment of the present invention.
Figure 18:
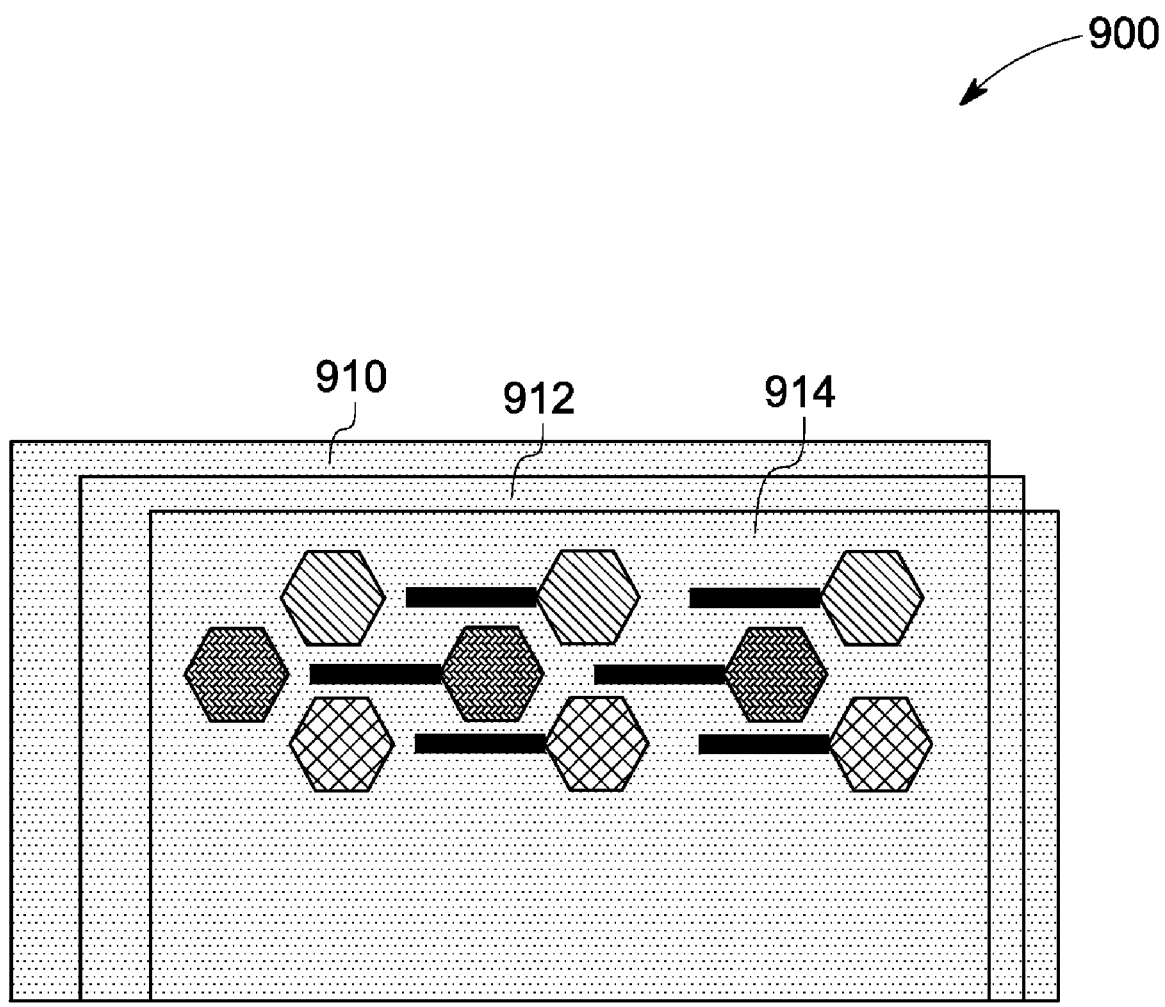
FIG. 18 is a schematic representation of an OLED illumination source including three overlaid OLED layers fabricated in accordance with the method illustrated in FIG. 16 in one embodiment of the present invention.

In another embodiment of the present invention is a schematic representation of a method 800 for fabricating an OLED layer in one embodiment of the present invention as illustrated in FIG. 17. An OLED layer is prepared by first forming an ITO anode 812 on a substrate 810. In one embodiment, the substrate 810 is a flexible substrate. In step 814 additional electroactive layers, such as electroluminescent layers 816, are coated by techniques such as for example microgravure coating. The electroactive layer is then removed in regions 818, by patterning techniques such as but not limited to solvent assisted wiping (SAW), such as described in US20060202612 A1. In step 820, the active light emitting OLED elements 822 and interconnect elements 824 are formed by metal deposition techniques such as but not limited to sputtering or evaporation of metal through a mask, so that the metal cathode establishes contact with the ITO anode via the area in which polymer was removed. For example, to form a hexagonal shaped OLED element, a hexagonal shaped cathode can be deposited. FIG. 18 is a schematic representation of an OLED illumination source 900 including three overlaid OLED layers 910, 912 and 914 fabricated in accordance with the method illustrated in FIG. 17.

Suitable electroluminescent layer materials may include light emitting polymeric or non-polymeric small molecule materials. Non-limiting examples of electroluminescent layer materials which may be used in the illumination source include poly(N-vinylcarbazole) (PVK) and its derivatives; polyfluorene and its derivatives and copolymers such as poly (alkylfluorene), for example poly(9,9-dihexylfluorene), poly (dioctylfluorene) or poly{9,9-bis(3,6-dioxaheptyl)-fluorene-2,7-diyl}, poly(para-phenylene) (PPP) and its derivatives such as poly(2-decyloxy-1,4-phenylene) or poly(2,5-diheptyl-1,4-phenylene); poly(p-phenylene vinylene) (PPV) and its derivatives such as dialkoxy-substituted PPV and cyano-substituted PPV; polythiophene and its derivatives such as poly(3-alkylthiophene), poly(4,4'-dialkyl-2,2'-bithiophene), poly(2,5-thienylene vinylene); poly(pyridine vinylene) and its derivatives; polyquinoxaline and its derivatives; and polyquinoline and its derivatives. In one particular embodiment a suitable light emitting material is poly(9,9-dioctylfluorenyl-2,7-diyl) end capped with N,N-bis(4-methylphenyl)-4-aniline. Mixtures of these polymers or copolymers based on one or more of these polymers and others may also be used.

Another class of suitable electroluminescent materials used in OLED devices are polysilanes. Typically, polysilanes are linear silicon-backbone polymers substituted with a variety of alkyl and/or aryl side groups. They are quasi one-dimensional materials with delocalized sigma-conjugated electrons along polymer backbone chains. Examples of polysilanes comprise poly(di-n-butylsilane), poly(di-n-pentylsilane), poly(di-n-hexylsilane), poly(methylphenylsilane), and poly{bis(p-butylphenyl)silane}.

In one embodiment, the metallized patterned electrode layer includes materials having low work function value. In a further embodiment, the metallized patterned layer is a cathode layer. Non-limiting examples of cathode layer materials include materials such as K, Li, Na, Mg, Ca, Sr, Ba, Al, Ag, Au, In, Sn, Zn, Zr, Sc, Y, Mn, Pb, elements of the lanthanide series, alloys thereof, particularly Ag—Mg alloy, Al—Li alloy, In—Mg alloy, Al—Ca alloy, and Li—Al alloy and mixtures thereof. Other examples of cathode materials may include alkali metal fluorides, or alkaline earth fluorides, or mixtures of fluorides. Other cathode materials such as indium tin oxide, tin oxide, indium oxide, zinc oxide, indium zinc oxide, zinc indium tin oxide, antimony oxide, carbon nanotubes, and mixtures thereof are also suitable. Alternatively, the cathode can be made of two layers to enhance electron injection. Non-limiting examples include, but are not limited to, an inner layer of either LiF or NaF followed by an outer layer of aluminum or silver, or an inner layer of calcium followed by an outer layer of aluminum or silver.

In one embodiment, the transparent electrode includes materials such as but not limited to high work function materials. Non-limiting examples of anode materials include, but are not limited to, indium tin oxide (ITO), tin oxide, indium oxide, zinc oxide, indium zinc oxide, nickel, gold, and like materials, and mixtures thereof. In some embodiments, the transparent substrate is found in combination with the transparent electrode. For example, an indium tin oxide/poly(ethylene terephthalate) combination layer may be used to form the OLED layer.

Non limiting examples of transparent substrates include poly(ethylene terephthalate), poly(ethylene naphthalate), polyethersulfone, polycarbonate, polyimide, acrylate, polyolefin, glass, very thin metal layers, and combinations thereof. In some embodiments, the transparent substrate is a flexible substrate rendering the illumination source flexible.

The OLED layers may further include other electroactive layers such as but not limited to hole transport layers, hole injection layers, electron transport layers, electron injection layers, and photoluminescent layers.

The various layers in the OLED elements can be deposited or disposed using techniques such as but not limited to spin coating, dip coating, reverse roll coating, wire-wound or Mayer rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic process, Langmuir process and flash evaporation, thermal or electron-beam assisted evaporation, vapor deposition, plasma-enhanced chemical-vapor deposition ("PECVD"), radio-frequency plasma-enhanced chemical-vapor deposition ("RFPECVD"), expanding thermal-plasma chemical-vapor deposition ("ETPCVD"), sputtering including, but not limited to, reactive sputtering, electron-cyclotron-resonance plasma-enhanced chemical-vapor deposition ("ECRPECVD"), inductively coupled plasma-enhanced chemical-vapor deposition ("ICPECVD"), and combinations thereof.

The illumination source of the present invention may include additional layers such as, but not limited to, one or more of abrasion resistant layers, chemically resistant layers, photoluminescent layers, radiation reflective layers, barrier layers, planarizing layers, optical scattering layers, optical diffuser layers, light enhancement layers, and combinations thereof.

In some embodiments of the present invention, the OLED layers in the illumination source are physically modular. As used herein, the term "physically modular" means that the layers can be individually removed or replaced. In a further embodiment, the layers are mounted using quick release connectors.

In certain embodiments of the present invention, the OLED layers in the illumination source are "electrically modular". As used herein, the term "electrically modular" refers to an attribute of a layer whereby the layer can be independently electrically controlled. For example, layers disposed within the illumination source of the present invention are "electrically modular" in that the voltage applied to each individual layer may be independently varied.

For example, in the illumination source 900, three OLED layers 910, 912 and 914, each emitting light of a different color are used. In one embodiment, each of the layers may be individually wired through connectors. In one embodiment, the anode contacts for the three OLED layers can be joined together, while the cathode contacts are electrically separate, still enabling separate electrical control of the three OLED layers. In one embodiment, two or more OLED layers may be connected in series. In another embodiment, the two or more OLED layers may be connected in parallel.

In one embodiment of the present invention, the illumination source may further include circuit elements for controlling and delivering electrical power to the OLED layers. In a further embodiment, the illumination source is configured to selectively power one or more OLED layers. One or more OLED elements included in an OLED layer may be further connected to circuit elements capable of controlling the light emission from each of the OLED elements as well. The illumination source may include circuit elements such as AC to DC converters and diodes placed in series, to convert available AC power to the required DC power. In a further embodiment, the illumination source may be directly powered by AC power. Non-limiting examples of other circuit elements which may be present in the illumination source include Zener diodes, resistors, varistors, voltage dividers, and capacitors.

In one embodiment of the present invention, the illumination source emission is color tunable. In a non-limiting example, the illumination source produces white light. In one embodiment the white light has a color temperature ranging from about 5500° K to about 6500° K. As used herein, "color temperature" of an illumination source refers to a temperature of a blackbody source having the closest color match to the illumination source in question. The color match is typically represented and compared on a conventional CIE (Commission International de l'Eclairage) chromaticity diagram. See, for example, "Encyclopedia of Physical Science and Technology", vol. 7, 230-231 (Robert A. Meyers ed, 1987). Generally, as the color temperature increases, the light appears more blue. As the color temperature decreases, the light appears more red. In another embodiment of the present invention, the illumination source emits white light having a color temperature ranging from about 2800° K to about 5500° K. In certain embodiments the illumination source emits white light having a color temperature ranging from about 2800° K to about 3500° K. In some embodiments, the illumination source has a color temperature about 4100° K.

In one embodiment, an illumination source with a color temperature in the range from about 5500° K to about 6500° K has a color rendering index ranging from about 60 to about 99. As used herein, color rendering index (CRI) is a measure of the degree of distortion in the apparent colors of a set of standard pigments when measured with the light source in question as opposed to a standard light source. The CRI is determined by calculating the color shift, e.g. quantified as tristimulus values, produced by the light source in question as opposed to the standard light source. Typically, for color temperatures below 5000° K, the standard light source used is a blackbody of the appropriate temperature. For color temperatures greater than 5000° K, sunlight is typically used as the standard light source. Light sources having a relatively continuous output spectrum, such as incandescent lamps, typically have a high CRI, e.g. equal to or near 100. Light sources having a multi-line output spectrum, such as high pressure discharge lamps, typically have a CRI ranging from about 50 to about 90. Fluorescent lamps typically have a CRI greater than about 60.

In a further embodiment, an illumination source with a color temperature in the range from about 5500° K to about 6500° K has a color rendering index ranging from about 75 to about 99. In a still further embodiment, an illumination source with a color temperature in the range from about 5500° K to about 6500° K has a color rendering index ranging from about 85 to about 99. In still another embodiment, an illumination source with a color temperature in the range from about 2800° K. to about 5500° K has a color rendering index of at least about 60. In still another embodiment, an illumination source with a color temperature in the range from about 2800° K to about 5500° K has a color rendering index of at least about 75. In still another embodiment, an illumination source with a color temperature in the range from about 2800° K to about 5500° K has a color rendering index of at least about 85.

In one embodiment, the illumination source can be used as an area illumination source. In an alternate embodiment, the illumination source can be used as a backlight device for display devices. In a further embodiment, the illumination source is flexible and can be conformally mounted on to a curved surface.

In one embodiment, the illumination source is mountable onto a structure. In a non-limiting example, the illumination source is adapted for wall mounting. The illumination source may alternatively be mounted upon the ceiling or be suspended from the ceiling. In an alternative embodiment, the illumination source is free standing.

In one embodiment, the illumination source of the present invention is a white light emitting source and is used as a backlight in a liquid crystal display (LCD) device. By modulating light transmission through the liquid crystal element, desired emissive color is achieved by filtering the transmitted white light.

In another embodiment, the illumination source of the present invention is a a color tunable illumination source and is used as a backlight in a liquid crystal display (LCD) device. In this embodiment, the display color is achieved by having red, green and blue light emitting OLED layers, or other suitable color combinations, as backlight. By sequentially applying red, green, and blue color (field sequential color) to the backlight, synchronized in a suitable way with electronic control of the liquid crystal elements, the desired color is emitted by the display without the use of color filters and the desired color is perceived by the human eye because of persistence of vision.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An illumination source comprising: a plurality of OLED layers fabricated on different substrates assembled in a stacked configuration, wherein at least one of the plurality of OLED layers comprises at least one OLED layer segment comprising an active light emitting region and a non-light emitting region, wherein the active light emitting region comprises a plurality of primary light-emitting OLED elements and connecting secondary light emitting OLED elements connecting each of the plurality of primary light emitting OLED elements to at least another primary light emitting OLED element of the plurality of primary light emitting OLED elements, wherein the area of each of the plurality of primary light emitting OLED elements is substantially greater than the area of each of the secondary light emitting OLED elements, and wherein one of the primary light emitting OLED elements of a first OLED layer of the plurality of OLED layers is stacked on one of the secondary light emitting OLED elements of a second OLED layer of the plurality of OLED layers.

2. The illumination source of claim 1, wherein the first OLED layer of the plurality of OLED layers is disposed over the second OLED layer such that the connecting secondary light emitting OLED elements of the first OLED layer are arranged partially over the plurality of primary light emitting OLED elements of the second OLED layer disposed below.

3. The illumination source of claim 1, wherein a non-light emitting region of the first OLED layer transmits a fraction greater than 50% of light emitted by the underlying second OLED layer in the visible region of the electromagnetic spectrum.

4. The illumination source of claim 1, wherein at least one of the plurality of OLED layers comprises a plurality of OLED layer segments, wherein each of the plurality of OLED layer segments is electrically series interconnected to at least another OLED layer segment.

5. The illumination source of claim 1, wherein the non-light emitting region comprises inactive non-light emitting OLED elements.

6. The illumination source of claim 1, wherein the non-light emitting region comprises substrate regions without OLED elements.

7. The illumination source of claim 1, wherein a shape of the primary light emitting OLED elements comprises a shape selected from the group consisting square, rectangular, triangular, pentagonal, hexagonal, quadrilateral, trapezoidal, rhombic, circular, eliptical elliptical, irregular and combinations thereof.

8. The illumination source of claim 1, wherein the secondary light emitting OLED elements comprise strip shaped elements.

9. The illumination source of claim 1, wherein the plurality of OLED layers are independently electrically operable.

10. The illumination source of claim 1, further comprising an adhesive layer between the first and second OLED layers.

11. The illumination source of claim 1, wherein the active light emitting region comprises a patterned metalized electrode layer.

12. The illumination source of claim 1, additionally comprising at least one light management element.

13. The illumination source of claim 12, wherein the at least one light management element is selected from the group consisting of a diffuser element, a scattering element, a high contrast patterned element, a transparent white light emitting element, lens, and combinations thereof.

14. The illumination source of claim 12, wherein the at least one light management element is a diffuser element, wherein the diffuser element is disposed at a distance less than about 25 mm from the top layer of the plurality of OLED layers.

15. The illumination source of claim 12, wherein the at least one light management element is a diffuser element, wherein the diffuser element is disposed at a distance less than about 5 mm from the top layer of the plurality of OLED layers.

16. The illumination source of claim 1, wherein the substrates are flexible.

17. The illumination source of claim 1, wherein the illumination source produces a white light having a color temperature ranging from about 5500° K. to about 6500° K.

18. The illumination source of claim 17, wherein the white light has a color rendering index ranging from about 60 to about 99.

19. The illumination source of claim 1, wherein the illumination source produces a white light having a color temperature ranging from about 3000° K. to about 5500° K.

20. The illumination source of claim 19, wherein the white light has a color rendering index of at least 60.

21. The illumination source of claim 1, wherein a combined fill factor of the active light emitting region of the plurality of OLED layers is greater than about 90% within a perimeter enclosing all of the at least one OLED layer segments.

22. The illumination source of claim 1, wherein a combined fill factor of the active light emitting region of the plurality of OLED layers is greater than about 95% within a perimeter enclosing all of the at least one OLED layer segment.

23. The illumination source of claim 1, wherein a combined fill factor of the active light emitting region of the plurality of OLED layers is greater than about 98% within a perimeter enclosing all of the at least one OLED layer segment.

24. An illumination source comprising: at least one OLED layer segment, the at least one OLED layer segment comprising groups of plurality of primary light-emitting OLED elements and connecting secondary light emitting OLED elements, wherein the secondary light emitting OLED elements connect each of the plurality of primary light emitting OLED elements to at least another primary light emitting OLED element of the plurality of primary light emitting OLED elements, wherein the area of each of the plurality of the primary light emitting OLED elements is substantially greater than the area of each of the secondary light emitting OLED elements, wherein at least one of the primary light emitting OLED elements of a first OLED layer is stacked on at least one of the secondary light emitting OLED elements of a second OLED layer, and wherein the primary light-emitting OLED elements of at least one of the groups are disposed adjacent to the secondary light emitting elements of another of at least one of the groups wherein at least two of the groups are configured to emit light in different wavelength ranges.

* * * * *